(12) United States Patent
Bianchi (10) Patent No.: US 11,430,957 B2
(45) Date of Patent: Aug. 30, 2022

(54) CONJUGATED POLYMERS INCLUDING AN INDACEN-4-ONE DERIVATIVE, PROCEDURE FOR THEIR PREPARATION AND PHOTOVOLTAIC DEVICES COMPRISING THE SAME

(71) Applicant: ENI S.P.A., Rome (IT)

(72) Inventor: Gabriele Bianchi, Novara (IT)

(73) Assignee: ENI S.P.A., Rome (IT)

( * ) Notice: Subject to any disclaimer, the term of this patent is extended or adjusted under 35 U.S.C. 154(b) by 0 days.

(21) Appl. No.: 17/277,897

(22) PCT Filed: Sep. 18, 2019

(86) PCT No.: PCT/IB2019/057843
§ 371 (c)(1),
(2) Date: Mar. 19, 2021

(87) PCT Pub. No.: WO2020/058860
PCT Pub. Date: Mar. 26, 2020

(65) Prior Publication Data
US 2021/0351355 A1 Nov. 11, 2021

(30) Foreign Application Priority Data
Sep. 19, 2018 (IT) .................. 102018000008724

(51) Int. Cl.
*H01L 51/00* (2006.01)
*C08G 61/12* (2006.01)
*H01L 51/42* (2006.01)

(52) U.S. Cl.
CPC ........ *H01L 51/0036* (2013.01); *C08G 61/126* (2013.01); *H01L 51/0043* (2013.01);
(Continued)

(58) Field of Classification Search
CPC ............. H01L 51/0036; H01L 51/0043; H01L 51/4253; H01L 51/0047; C08G 61/126;
(Continued)

(56) References Cited

U.S. PATENT DOCUMENTS

2013/0092912 A1* 4/2013 You .................. C07D 285/14
548/134
2014/0151680 A1* 6/2014 Terai .................. C07D 495/04
526/256

FOREIGN PATENT DOCUMENTS

WO    2016180988 A1    11/2016
WO    2017081623 A1     5/2017

OTHER PUBLICATIONS

International Search Report dated Oct. 22, 2019 for PCT application No. PCT/IB2019/057843.
(Continued)

*Primary Examiner* — Shane Fang
(74) *Attorney, Agent, or Firm* — Ruggiero McAllister & McMahon LLC

(57) ABSTRACT

There is a conjugated polymer having a derivative of indacen-4-one having general formula (I):

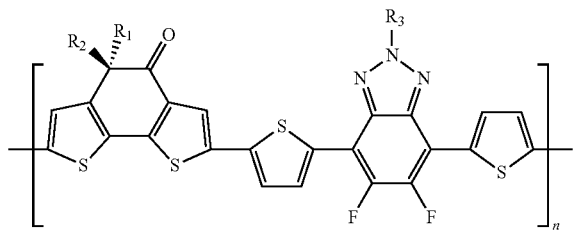

(I)

wherein:
$R_1$ and $R_2$, same or different, are selected from $C_1$-$C_{30}$ alkyl groups, linear or branched; optionally substituted cycloalkyl groups; optionally substituted aryl groups; optionally substituted heteroaryl groups; $C_1$-$C_{30}$ alkoxyl groups, linear or branched; $R_4$—O—[$CH_2$—$CH_2$—O]$_m$— polyoxyethylene groups, wherein $R_4$ is selected from $C_1$-$C_{30}$ alkyl groups, linear or branched, and m is an integer ranging from 1 to 4; —$R_5$—$OR_6$ groups, wherein $R_5$ is selected from $C_1$-$C_{30}$ alkylene
(Continued)

groups, linear or branched, and $R_6$ represents a hydrogen atom or is selected from $C_1$-$C_{30}$ alkyl groups, linear or branched, or is selected from $R_4$—[—$OCH_2$—$CH_2$—]$_p$— polyoxyethylene groups, wherein $R_4$ has the same meanings as reported above and p is an integer ranging from 1 to 4; —$COR_7$ groups, wherein $R_7$ is selected from $C_1$-$C_{30}$ alkyl groups, linear or branched; —$COOR_8$ groups, wherein $R_8$ is selected from $C_1$-$C_{30}$ alkyl groups, linear or branched; or they represent a —CHO group or a cyano (—CN) group; $R_3$ is selected from $C_1$-$C_{30}$ alkyl groups, linear or branched; optionally substituted cycloalkyl groups; optionally substituted aryl groups; and $C_1$-$C_{30}$ alkoxyl groups, linear or branched; n is an integer ranging from 10 to 500. There is also a photovoltaic device (or solar device) having a support having the conjugated polymer having a derivative of indacen-4-one.

11 Claims, 5 Drawing Sheets

(52) U.S. Cl.
CPC .............. *C08G 2261/124* (2013.01); *C08G 2261/1412* (2013.01); *C08G 2261/18* (2013.01); *C08G 2261/228* (2013.01); *C08G 2261/3223* (2013.01); *C08G 2261/3241* (2013.01); *C08G 2261/91* (2013.01); *H01L 51/4253* (2013.01)

(58) Field of Classification Search
CPC ...... C08G 2261/124; C08G 2261/1412; C08G 2261/18; C08G 2261/228; C08G 2261/3223; C08G 2261/3241; C08G 2261/91; C08G 2261/3243; C08G 2261/3246; C08G 2261/414; C07D 417/14; Y02E 10/549
See application file for complete search history.

(56) References Cited

OTHER PUBLICATIONS

Written Opinion dated Oct. 22, 2019 for PCT application No. PCT/IB2019/057843.

\* cited by examiner

PRIOR ART

CONJUGATED POLYMERS INCLUDING AN INDACEN-4-ONE DERIVATIVE, PROCEDURE FOR THEIR PREPARATION AND PHOTOVOLTAIC DEVICES COMPRISING THE SAME

CROSS-REFERENCE TO RELATED APPLICATIONS

The present application claims priority based on PCT Application No. PCT/1132019/057843, filed Sep. 18, 2019, which claims priority based on Italy Patent Application No. 102018000008724, filed Sep. 19, 2019, both of which are incorporated herein by reference in their entireties.

FIELD OF THE DISCLOSURE

The present disclosure relates to a conjugated polymer comprising a derivative of indacen-4-one. More particularly, the present disclosure relates to a conjugated polymer comprising a derivative of indacen-4-one containing sulfur.

Said conjugated polymer comprising a derivative of indacen-4-one may be advantageously used in the construction of photovoltaic devices (or solar devices) such as, for example, photovoltaic cells (or solar cells), photovoltaic modules (or solar modules), either on a rigid support, or on flexible support.

Consequently, the present disclosure also relates to a photovoltaic device (or solar device) such as, for example, a photovoltaic cell (or solar cell), a photovoltaic module (or solar module), either on a rigid support, or on a flexible support, comprising said conjugated polymer comprising a derivative of indacen-4-one.

Photovoltaic devices (or solar devices) are devices capable of converting the energy of light radiation into electrical energy. Currently, most photovoltaic devices (or solar devices) that may be used for practical applications exploit the chemical-physical properties of photoactive materials of inorganic type, in particular high purity crystalline silicon. However, due to the high production costs of silicon, scientific research has for some time been directed towards the development of alternative materials of organic type having a conjugated structure, oligomeric or polymeric, in order to obtain organic photovoltaic devices (or solar devices) such as, for example, organic photovoltaic cells (or solar cells). In fact, unlike high purity crystalline silicon, said organic materials are characterised by being relatively easy to synthesize, and by low production costs, reduced weight of the respective organic photovoltaic devices (or solar devices), as well as by allowing the recycling of said organic materials at the end of the life cycle of the photovoltaic device (or solar device) wherein they are used.

The abovementioned advantages make the use of said materials of organic type attractive in energy and economic terms despite any lower efficiencies ($\eta$) of the organic photovoltaic devices (or solar devices) thus obtained as compared with inorganic photovoltaic devices (or solar devices).

The operation of organic photovoltaic devices (or solar devices), such as, for example, organic photovoltaic cells (or solar cells), is based on the combined use of an electron-acceptor compound and an electron-donor compound. In the state of the art, the electron-acceptor compounds most commonly used in organic photovoltaic devices (or solar devices) are fullerene derivatives, in particular PC61BM (6,6-phenyl-$C_{61}$-butyric acid methyl ester) or PC71BM (6,6-phenyl-$C_{71}$-butyric acid methyl ester), which have led to the highest efficiencies when mixed with electron-donor compounds selected from $\pi$-conjugated polymers such as, for example, polythiophenes ($\eta$>5%), polycarbazoles ($\eta$>6%), derivatives of poly(thienothiophene)benzodithiophene (PTB) ($\eta$>8%).

The elementary process of converting light into electrical current in an organic photovoltaic cell (or solar cell) is known to take place through the following stages:
1. absorption of a photon by the electron-donor compound with formation of an exciton, i.e. a pair of "electron-electronic gap (or hole)" charge carriers;
2. diffusion of the exciton into a region of the electron-donor compound up to the interface with the electron-acceptor compound;
3. dissociation of the exciton into the two charge carriers: electron (−) in the accepting phase (i.e. in the electron-acceptor compound) and electronic gap [(or hole) (+)] in the donor phase (i.e. in the electron-donor compound);
4. transport of the charges thus formed to the cathode (electron by means of the electron-acceptor compound) and to the anode (electronic gap (or hole) by means of the electron-donor compound), with generation of an electrical current in the circuit of the organic photovoltaic cell (or solar cell).

The process of photoabsorption with exciton formation and subsequent electron transfer to the electron-acceptor compound involves the excitation of an electron from the HOMO ("Highest Occupied Molecular Orbital") to the LUMO ("Lowest Unoccupied Molecular Orbital") of the electron-donor compound and, subsequently, the passage therefrom to the LUMO of the electron-acceptor compound.

Since the efficiency of an organic photovoltaic cell (or solar cell) depends on the number of free electrons that are generated by dissociation of the excitons, which in turn may be directly correlated to the number of photons absorbed, one of the structural characteristics of the electron-donor compounds that most affects this efficiency is the difference in energy between the HOMO and LUMO orbitals of the electron-donor compound, or the so-called band-gap. In particular, the maximum value of the wavelength at which the electron-donor compound is able to collect and effectively convert photons into electrical energy, or the so-called "light harvesting" or "photon harvesting" process, depends on this difference. In order to obtain acceptable electrical currents, the band-gap, i.e. the energy difference between HOMO and LUMO of the donor compound, while on the one hand needing to be not too high to allow the absorption of the maximum number of photons, must on the other hand not be too low, because this could lower the voltage at the electrodes of the device.

In the simplest way of working, organic photovoltaic cells (or solar cells) are manufactured by introducing between two electrodes, usually consisting of indium-tin oxide (ITO) (anode) and aluminium (Al) (cathode), a thin layer (about 100 nanometres) of a mixture of the electron-acceptor compound and the electron-donor compound (architecture known as "bulk heterojunction"). Generally, in order to make a layer of this type, a solution of the two compounds is prepared and, subsequently, a photoactive film is created on the anode [indium-tin oxide (ITO)] from this solution, using appropriate deposition techniques such as, for example, spin-coating, spray-coating, ink-jet printing, and the like. Finally, the counter electrode (i.e. the aluminium cathode (Al)) is deposited on the dried film. Optionally, between the electrodes and the photoactive film, other additional layers—generally known as buffer layers—may be introduced, capable of performing specific functions of an electrical, optical, or mechanical nature.

Generally, in order to facilitate the electronic gaps (or holes) reaching the anode [indium tin oxide (ITO)], and at the same time to block the transport of electrons, thus improving the harvesting of charges by the electrode and inhibiting recombination phenomena, before creating the photoactive film from the mixture of the acceptor compound and the donor compound as described above, a film is deposited from an aqueous suspension of PEDOT:PSS [poly (3,4-ethylenedioxythiophene)polystyrene sulfonate], using appropriate deposition techniques such as, for example, spin-coating, spray-coating, ink-jet printing, and the like.

The electron-donor compound most commonly used in the manufacture of organic photovoltaic cells (or solar cells) is the regioregular poly(3-hexylthiophene) (P3HT). This polymer has optimal electronic and optical characteristics (good values of the HOMO and LUMO orbitals, good molar absorption coefficient), good solubility in solvents used to manufacture photovoltaic cells (or solar cells), and discrete mobility of electron holes.

Other examples of polymers that may be advantageously used as electron-donor compounds are: the polymer PCDTBT {poly[N-9''-heptadecanyl-2,7-carbazole-alt-5,5-(4',7'-di-2-thienyl-2',1',3'-benzothiadiazole]}, the polymer PCPDTBT {poly[2,6-(4,4-bis-(2-ethylhexyl)-4H-cyclo-penta[2,1-b;3,4-b']-dithiophene)-alt-4,7-(2,1,3-benzothiadi-azole)]}.

Electron-donor compounds containing benzodithiophene units are also known that have a structure similar to poly (3-hexylthiophene) (P3HT) wherein, however, the thiophene units are planarized by means of benzene rings. This characteristic, as well as reducing the oxidation potential of said electron-donor compounds, improves their stability in air and ensures their rapid packing and, consequently, a high molecular order, during production of the photoactive film: this translates into excellent properties of transport of charges [electrons or electronic gaps (holes)]. Consequently, the use of electron-donor compounds containing benzodithiophene units can allow the realization of photovoltaic devices with improved performance.

For example, electron-donor compounds containing benzodithiophene units are described by Huo L. et al. in the article: "Synthesis of a polythieno[3,4-b]thiophene derivative with a low-lying HOMO level and its application in polymer solar cells", Chemical Communication (2011), Vol. 47, pages 8850-8852. Said article describes the preparation of a polythieno[3,4-b]thiophene derivative for copolymerization between a planar benzodithiophene having a low HOMO value and a thieno[3,4-b]thiophene unit.

It is known that benzodithiophene and/or its isomers [e.g., benzo[1,2-b:4,5-b']dithiophene or (BDT) and benzo[2,1-b: 3,4-b']dithiophene or (BDP)], are compounds of significant interest the synthesis of which has been the subject of numerous research projects.

Generally, the electron-donor materials used in high-efficiency photovoltaic cells are almost exclusively represented by polymers wherein an electron-rich unit alternates with an electron-poor unit. Further details on said polymers may be found, for example, in the following articles: Yu L. et al., "How to design low band-gap polymers for highly efficient organic solar cells", Materials Today (2014), Vol. 17, No. 1, pages 11-15; You W. et al.: "Structure-Property Optimizations in Donor Polymers via Electronics, Substituents, and Side Chains Toward High Efficiency Solar Cells", *Macromolecular Rapid Communications* (2012), Vol. 33, pages 1162-1177; Havinga E. E. et al.: "A new class of small band-gap organic polymer conductors", *Polymer Bulletin* (1992), Vol. 29, pages 119-126.

However, said electron-donor polymers are not always optimal. In fact, since the photon flow of solar radiation reaching the surface of the earth is maximum for energy values around 1.8 eV (corresponding to radiation with a wavelength of about 700 nm), due to the high band-gap values (generally higher than 2 eV-3 eV) that characterise many of the aforementioned electron-donor polymers, the so-called process of "light harvesting" or "photon harvesting" is not very efficient and only part of the total solar radiation is converted into electrical energy.

In order to improve the yield of the so-called "light harvesting" or "photon harvesting" process and, consequently, the efficiency of organic photovoltaic (or solar) devices, it is therefore essential to identify new electron-donor polymers capable of capturing and converting solar radiation wavelengths having lower energy, i.e. electron-donor polymers characterized by lower band-gap values than those of polymers typically used as electron-donors.

For this purpose, efforts have therefore been made in the art to identify electron-donor polymers having a low value of band-gap. (i.e. a band-gap value of less than 2 eV).

For example, one of the most commonly used strategies to obtain electron-donor polymers with a low band-gap value is the synthesis of alternating conjugated polymers comprising electron-rich units (donor) and electron-poor units (acceptor). Such a synthesis is described, for example, by Chen J. et al. in the article "Development of Novel Conjugated Donor Polymers for High-Efficiency Bulk-Heterojunction Photovoltaic Devices", *Account of Chemical Research* (2009), Vol. 42(11), pages 1709-1718.

The international patent application WO 2016/180988, in the name of the Applicant, relates to a derivative of indacen-4-one which may be advantageously used as a monomer unit in the synthesis of electron-donor polymers with a low band-gap value. (i.e. a band-gap value of less than 2 eV) which can in turn be used in the construction of photovoltaic (or solar) devices.

The Applicant has therefore posed the problem of finding electron-donor polymers having a low band-gap value (i.e. a band-gap value of less than 2 eV) capable of giving higher performances, in particular in terms of energy conversion efficiency ($PCE_{av}$) calculated as described below, of the photovoltaic devices (or solar devices) wherein they are used, both with respect to known electron-donor polymers and with respect to electron-donor polymers specifically described in the international patent application WO 2016/180988 above reported.

The Applicant has now found that some electron-donor polymers not specifically described in the international patent application WO 2016/180988 above reported, in particular conjugated polymers comprising a derivative of indacen-4-one containing sulfur having the specific general formula (I) below reported, are able to give the above performances. Said conjugated polymers comprising a derivative of indacen-4-one containing sulfur may be advantageously used in the construction of photovoltaic devices (or solar devices) such as, for example, photovoltaic cells (or solar cells), photovoltaic modules (or solar modules), either on a rigid support, or on a flexible support. More particularly, said conjugated polymers comprising a derivative of indacen-4-one containing sulfur have a low value of band-gap. (i.e. a band-gap value of less than 2 eV) and are capable of giving higher performances, particularly in terms of energy conversion efficiency ($PCE_{av}$) calculated as described below, of the photovoltaic devices (or solar devices) wherein they are used, both with respect to known electron-donor polymers and with respect to electron-donor polymers specifically described in the international patent application WO 2016/180988 above reported.

The subject of the present disclosure is therefore a conjugated polymer comprising a derivative of indacen-4-one having general formula (I):

(I)

wherein:
  $R_1$ and $R_2$, the same as or different from each other, preferably the same as each other, are selected from $C_1$-$C_{30}$, preferably $C_2$-$C_{20}$ alkyl groups, linear or branched; optionally substituted cycloalkyl groups; optionally substituted aryl groups; optionally substituted heteroaryl groups; $C_1$-$C_{30}$, preferably $C_2$-$C_{20}$, alkoxyl groups, linear or branched; $R_4$—O—[$CH_2$—$CH_2$—O]$_n$— polyoxyethylene groups wherein $R_4$ is selected from $C_1$-$C_{30}$, preferably $C_2$-$C_{20}$, alkyl groups, linear or branched, and n is an integer ranging from 1 to 4; —$R_5$—$OR_6$ groups wherein $R_5$ is selected from $C_1$-$C_{30}$, preferably $C_2$-$C_{20}$, alkylene groups, linear or branched, and $R_6$ represents a hydrogen atom or is selected from $C_1$-$C_{30}$, preferably $C_2$-$C_{20}$, alkyl groups, linear or branched, or is selected from $R_4$—[—$OCH_2$—$CH_2$-]$_p$-polyoxyethylene groups wherein $R_4$ has the same meanings as above and p is an integer ranging from 1 to 4; —$COR_7$ groups wherein $R_7$ is selected from $C_1$-$C_{30}$, preferably $C_2$-$C_{20}$, alkyl groups, linear or branched; —$COOR_8$ groups wherein $R_8$ is selected from $C_1$-$C_{30}$, preferably $C_2$-$C_{30}$, alkyl groups, linear or branched; or they represent a —CHO group, or a cyano (—CN) group;
  $R_3$ is selected from $C_1$-$C_{30}$, preferably $C_2$-$C_{20}$, alkyl groups, linear or branched; optionally substituted cycloalkyl groups; optionally substituted aryl groups; $C_1$-$C_{30}$, preferably $C_2$-$C_{20}$, alkoxyl groups, linear or branched;
  n is an integer ranging from 10 to 500, preferably ranging from 20 to 300.

For the purpose of the present description and of the following claims, the definitions of the numerical ranges always comprise the extremes unless otherwise specified.

For the purpose of the present description and of the following claims, the term "comprising" also includes the terms "which consists essentially of" or "which consists of".

The term "$C_1$-$C_{30}$ alkyl groups" is understood to mean alkyl groups with 1 to 30 carbon atoms, linear or branched, saturated or unsaturated. Specific examples of $C_1$-$C_{30}$ alkyl groups are: methyl, ethyl, n-propyl, iso-propyl, n-butyl, iso-butyl, t-butyl, pentyl, ethylhexyl, hexyl, heptyl, n-octyl, nonyl, decyl, dodecyl, 3,7-dimethyloctyl, 2-ethylhexyl, 2-butyloctyl, 2-hexyldecyl, 2-octyldecyl, 2-octyldodecyl, 2-decyltetradecyl.

The term "cycloalkyl groups" is understood to mean cycloalkyl groups with 3 to 30 carbon atoms. Said cycloalkyl groups may be optionally substituted with one or more groups, the same as or different from each other, selected from: halogen atoms such as, for example, fluorine, chlorine, bromine, preferably fluorine; hydroxyl groups; $C_1$-$C_{12}$ alkyl groups; $C_1$-$C_{12}$ alkoxyl groups; $C_1$-$C_{12}$ thioalkoxyl groups; $C_3$-$C_{24}$ tri-alkylsilyl groups; polyoxyethylene groups; cyano groups; amino groups; $C_1$-$C_{12}$ mono- or di-alkylamine groups; nitro groups. Specific examples of cycloalkyl groups are: cyclopropyl, 2,2-difluorocyclopropyl, cyclobutyl, cyclopentyl, cyclohexyl, methylcyclohexyl, methoxycyclohexyl, fluorocyclohexyl, phenylcyclohexyl, decalin, abiethyl.

The term "aryl groups" is understood to mean aromatic carbocyclic groups containing 6 to 60 carbon atoms. Said aryl groups may optionally be substituted with one or more groups, the same as or different from each other, selected from: halogen atoms such as, for example, fluorine, chlorine, bromine, preferably fluorine; hydroxyl groups; $C_1$-$C_{12}$ alkyl groups; $C_1$-$C_{12}$ alkoxyl groups; $C_1$-$C_{12}$ thioalkoxyl groups; $C_3$-$C_{24}$ tri-alkylsilyl groups; polyoxyethylene groups; cyano groups; amino groups; $C_1$-$C_{12}$ mono- or di-alkylamine groups; nitro groups. Specific examples of aryl groups are: phenyl, methylphenyl, trimethylphenyl, methoxyphenyl, hydroxyphenyl, phenyloxyphenyl, fluorophenyl, pentafluorophenyl, chlorophenyl, bromophenyl, nitrophenyl, dimethylaminophenyl, naphthyl, phenylnaphthyl, phenanthrene, anthracene.

The term "heteroaryl groups" is understood to mean aromatic heterocyclic, penta- or hexa-atomic groups, also benzocondensed or heterobicyclic groups, containing from 4 to 60 carbon atoms and from 1 to 4 heteroatoms selected from nitrogen, oxygen, sulfur, silicon, selenium, phosphorus. Said heteroaryl groups may optionally be substituted with one or more groups, the same as or different from each other, selected from: halogen atoms such as, for example, fluorine, chlorine, bromine, preferably fluorine; hydroxyl groups; $C_1$-$C_{12}$ alkyl groups; $C_1$-$C_{12}$ alkoxyl groups; $C_1$-$C_{12}$ thioalkoxyl groups; $C_3$-$C_{24}$ tri-alkylsilyl groups; polyoxyethylene groups; cyano groups; amino groups; $C_1$-$C_{12}$ mono- or di-alkylamine groups; nitro groups. Specific examples of heteroaryl groups are: pyridine, methylpyridine, methoxypyridine, phenylpyridine, fluoropyridine, pyrimidine, pyridazine, pyrazine, triazine, tetrazine, quinoline, quinoxaline, quinazoline, furan, thiophene, hexylthiophene, bromothiophene, dibromothiophene, pyrrole, oxazole, thiazole, isoxazole, isothiazole, oxadiazole, thiadiazole, pyrazole, imidazole, triazole, tetrazole, indole, benzofuran, benzothiophene, benzoxazole, benzothiazole, benzoxadiazole, benzothiadiazole, benzopyrazole, benzimidazole, benzotriazole, triazolopyridine, triazolopyrimidine, coumarin.

The term "$C_1$-$C_{30}$ alkoxyl groups" is understood to mean groups comprising an oxygen atom to which is bound a $C_1$-$C_{30}$ alkyl group, linear or branched, saturated or unsaturated. Specific examples of $C_1$-$C_{30}$ alkoxyl groups are: methoxyl, ethoxyl, n-propoxyl, iso-propoxyl, n-butyl, iso-butyl, t-butyl, pentoxyl, hexyloxyl, 2-ethylhexyloxyl, heptyloxyl, octyloxyl, nonyloxyl, decyloxyl, dodecyloxyl, 2-butyloctyloxyl, 2-hexyldecyloctyl, 2-octyldecyloxyl, 2-decyltetradecyloxyl.

The term "$C_1$-$C_{30}$ alkylene-groups" means alkylene-groups with 1 to 30 carbon atoms, linear or branched. Specific examples of $C_1$-$C_{30}$ alkylene groups are: methylene, ethylene, n-propylene, iso-propylene, n-butylene, iso-butylene, t-butylene, pentylene, ethylhexylene, hexylene, heptylene, octylene, nonylene, decylene, dodecylene.

The term "poloxyethylene groups" is understood to mean a group having oxyethylene units in the molecule. Specific examples of a polyoxyethylene group are: methyloxy-ethylenoxyl, methyloxy-diethylenoxyl, 3-oxatetraoxyl, 3,6-dioxaheptyloxyl, 3,6,9-trioxadecyloxyl, 3,6,9,12-tetraoxyhexadecyloxyl.

In accordance with a preferred embodiment of the present disclosure, in said general formula (I):
- $R_1$ and $R_2$, the same as each other, are selected from $C_1$-$C_{30}$, preferably $C_2$-$C_{20}$, alkyl groups, linear or branched; preferably they are a 3,7-dimethyloctyl group, or a dodecyl group;
- $R_3$ is selected from $C_1$-$C_{30}$, preferably $C_2$-$C_{20}$, alkyl groups, linear or branched; preferably it is a 2-octyldodecyl group;
- n is an integer ranging from 20 to 300.

The conjugated polymer comprising a derivative of indacen-4-one having general formula (I) which is the subject of the present disclosure may be obtained by means of processes known in the art.

For example, the conjugated polymer comprising a derivative of indacen-4-one having general formula (I) that is the subject of the present disclosure may be obtained by a process comprising reacting at least one halogenated indacen-4-one derivative having general formula (II):

(II)

wherein $R_1$ and $R_2$ have the same meanings as described above and X represents a halogen atom such as, for example, chlorine, bromine, iodine, preferably bromine, with at least one benzotriazole disubstituted with thiophene groups having general formula (III):

(III)

wherein $R_2$ has the same meaning as described above and Q represents an Sn(R)$_3$ group wherein R, the same as or different from each other, are selected from $C_1$-$C_{30}$, preferably $C_2$-$C_{20}$, alkyl groups, linear or branched, or represents a B(OR')$_3$ group wherein R', the same as or different from each other, represent a hydrogen atom, or are selected from $C_1$-$C_{30}$, preferably $C_2$-$C_{20}$, alkyl groups, linear or branched, or the OR' groups, together with the other atoms to which they are bound, can form a heterocyclic ring having one of the following formulae:

wherein R', the same as or different from each other, represent a hydrogen atom, or are selected from $C_1$-$C_{30}$, preferably $C_2$-$C_{20}$, alkyl groups, linear or branched.

The abovementioned process may be carried out according to techniques known in the art as described, for example, by Xu J. et al., in the article "Effect of fluorination of the electrochromic performance of benzothiadiazole-based donor-acceptor copolymers", Journal of Materials Chemistry (2015), Vol. 3, pages 5589-5597.

Further details on the processes for the preparation of conjugated polymer comprising a derivative of indacen-4-one having general formula (I) which is the subject of the present disclosure may be found, for example, both in the international patent application WO 2016/180988 mentioned above in the name of the Applicant and incorporated herein as a reference, and in the following examples.

As mentioned above, said conjugated polymer comprising a derivative of indacen-4-one may be advantageously used in the construction of photovoltaic devices (or solar devices) such as, for example, photovoltaic cells (or solar cells), photovoltaic modules (or solar modules), either on a rigid support, or on a flexible support.

Consequently, the present disclosure also relates to a photovoltaic device (or solar device) such as, for example, a photovoltaic cell (or solar cell), a photovoltaic module (or solar module), either on a rigid support, or on a flexible support, comprising at least one conjugated polymer comprising a derivative of indacen-4-one having general formula (I).

Figure 5:
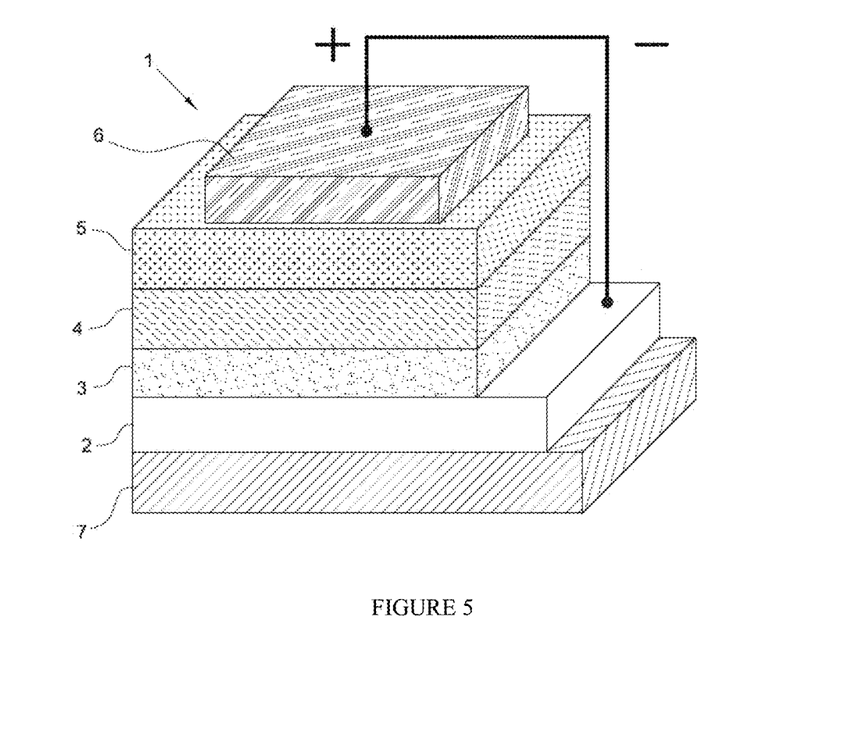
FIG. 5 depicts a cross-sectional view of an inverted polymer photovoltaic cell (or solar cell) used in Examples 4-7.

FIG. 5 below reported represents a cross-sectional view of an inverted polymer photovoltaic cell (or solar cell) used in Examples 4-7 below reported.

With reference to FIG. 5, the inverted polymer photovoltaic cell (or solar cell (1) comprises:
- a transparent glass support (7);
- an indium-tin oxide (ITO) cathode (2);
- a cathodic buffer layer (3) comprising zinc oxide (ZnO);
- a layer of photoactive material (4) comprising regioregular poly(3-hexylthiophene) (P3HT) and [6,6]-phenyl-$C_{61}$-butyric acid methyl ester (PC$_{61}$BM);
- an anodic buffer layer (5) comprising PEDOT:PSS [poly(3,4-ethylenedioxythiophene):polystyrene sulfonate];
- an anode (6) of silver (Ag).

In order to better understand the present disclosure and to put it into practice, the following are some illustrative and non-limiting examples of the same.

EXAMPLES

Molecular Weight Determination

The molecular weight of the conjugated polymers that are the subject of the present disclosure, obtained by working in accordance with the examples below reported, was determined by Gel Permeation Chromatography (GPC) on a WATERS 150C instrument, using HT5432 columns, with trichlorobenzene eluent, at 80° C.

The weight average molecular weight ($M_w$), the numerical average molecular weight ($M_n$) and the polydispersion index (PDI), corresponding to the $M_w/M_n$ ratio, are reported.

Determination of the Optical Band-Gap

The conjugated polymers that are the subject of the present disclosure obtained by working in accordance with the following examples, have been characterised by UV-Vis-NIR spectroscopy to determine the energy entity of the optical band-gap in solution or on thin film according to the following procedure.

In the case wherein the optical band-gap was measured in solution, the polymer was dissolved in toluene, chloroform, chlorobenzene, dichlorobenzene, trichlorobenzene, or another suitable solvent. The solution thus obtained was placed in a quartz cuvette and analysed in transmission by means of a Perkin Elmer λ 950 dual beam, dual monochromator UV-Vis-NIR spectrophotometer, within the range 200 nm-850 nm, with a bandwidth of 2.0 nm, a scanning speed of 220 nm/min and a step of 1 nm, using as reference an identical quartz cuvette containing only the solvent used as reference.

In the case wherein the optical band-gap was measured on a thin film, the monomer or the polymer was dissolved in toluene, chloroform, chlorobenzene, dichlorobenzene, trichlorobenzene, or another suitable solvent, resulting in a solution with a concentration of about 10 mg/ml, which was deposited, for spin-coating, on a Suprasil quartz slide. The resulting thin film was analysed in transmission using a Perkin Elmer λ 950 dual beam, dual monochromator, UV-Vis-NIR spectrophotometer within the range 200 nm-850 nm, with a bandwidth of 2.0 nm, a scanning speed of 220 nm/min and a step of 1 nm, using an identical Suprasil quartz slide, as is, as a reference.

The optical band-gap was estimated from the transmission spectra by measuring the absorption edge corresponding to the transition from the valence band (VB) to the conduction band (CB). For the determination of the edge, the intersection with the X axis of the straight line tangent to the absorption band at the point of inflection was used.

The inflection point ($\lambda_F$, $\gamma_F$) was determined from the minimum coordinates of the first derivative spectrum, indicated with $\lambda'_{min}$ and $\gamma'_{min}$.

The equation of the straight line tangent to the UV-Vis spectrum at the inflection point ($\lambda_F$, $\gamma_F$) is as follows:

$$\gamma = \gamma'_{min} + \lambda \gamma_F - \gamma'_{min} \lambda'_{min}$$

Finally, from the condition of intersection with the X axis $\gamma = 0$, the following was obtained:

$$\lambda_{EDGE} = (\gamma'_{min}\lambda'_{min} - \gamma_F)/\gamma'_{min}$$

Therefore, by measuring the minimum coordinates of the first derivative spectrum and the corresponding absorbance value $\gamma_F$ from the UV-Vis spectrum, $\lambda_{EDGE}$ was obtained directly by substitution.

The corresponding energy is:

$$E_{EDGE} = h\nu_{EDGE} = h\,c/\lambda_{EDGE}$$

wherein:
 h=6.626 10-34 J s;
 c=2.998 108 m s$^{-1}$;
which is to say:

$$E_{EDGE} = 1.98810\text{-}16 J/\lambda_{EDGE}(nm).$$

Remembering, finally, that 1 J=6.241018 eV, we have:

$$E_{EDGE} = 1240\ eV/\lambda_{EDGE}(nm).$$

Determination of HOMO and LUMO

The determination of the HOMO and LUMO values of the conjugated polymers that are the subject of the present disclosure, obtained by working in accordance with the following examples, was carried out using the cyclic voltammetry (CV) technique. With this technique it is possible to measure the values of the formation potentials of the radical cation and the radical anion of the sample under examination. These values, inserted into an appropriate equation, allow the HOMO and LUMO values of the polymer in question to be obtained. The difference between HOMO and LUMO gives the value of the electrochemical band-gap.

The values of the electrochemical band-gap are generally higher than the values of the optical band-gap because, during the execution of cyclic voltammetry (CV), the neutral compound is added and undergoes a conformational reorganization, with an increase in the energy gap, while the optical measurement does not lead to the formation of added species.

Cyclic voltammetry (CV) measurements were performed with an Autolab PGSTAT12 potentiostat (with GPES Ecochemie software) in a three-electrode cell. In the measurements carried out, an Ag/AgCl electrode was used as the reference electrode, a platinum wire as the counter electrode and a vitreous graphite electrode as the working electrode. The sample to be analysed was dissolved in a suitable solvent and then placed, with a calibrated capillary, on the working electrode to form a film. The electrodes were immersed in a 0.1 M electrolyte solution of 95% tetrabutylammonium tetrafluoroborate in acetonitrile. The sample was then subjected to a cyclic potential with triangular waveform. At the same time, depending on the difference in potential applied, the current was monitored, which signals the occurrence of reactions of oxidation or of reduction of the species present.

The oxidation process corresponds to the removal of an electron from the HOMO, while the reduction cycle corresponds to the introduction of an electron into the LUMO. Radical cation and radical anion formation potentials were derived from the peak onset value ($E_{onset}$), which was determined by molecules and/or chain segments with HOMO-LUMO levels closer to the band margins. Electrochemical potentials at those related to electronic levels may be correlated if both are referred to vacuum. For this purpose, the potential of ferrocene in vacuum, known in the literature and equal to −4.8 eV, was taken as a reference. The intersolvential redox pair ferrocene/ferrocine (Fc/Fc+) was selected because it has an oxidation-reduction potential independent of the working solvent.

The general formula for calculating the energies of the HOMO-LUMO levels is therefore given by the following equation:

$$E(eV) = -4{,}8 + [E_{1/2\ Ag/AgCl}(Fc/Fc^+) - E_{onset\ Ag/AgCl}(\text{polymer})]$$

wherein:

E=HOMO or LUMO depending on the $E_{onset}$ value entered;

$E_{1/2\ Ag/AgCl}$=half wave potential of the peak corresponding to the ferrocene/ferrocine redox pair measured under the same conditions of sample analysis and with the same set of three electrodes used for the sample;

$E_{onsetAg/AgCl}$=onset potential measured for the polymer in the anodic zone when HOMO is to be calculated and in the cathodic zone when LUMO is to be calculated.

Example 1

Preparation of 4,7-bis[5-(tributylstannyl)thiophene-2-yl]-5,6-difluoro-2-(2-octyldodecyl)-2H-benzotriazole Having General Formula (IIIa)

(IIIa)

To a 250-ml flask, equipped with magnetic stirring, the following were added under a stream of argon in the following order: 5,6-difluoro-2-(2-octyldodecyl)-4,7-di(thiophene-2-yl)-2H-benzotriazole (Sunatech) (1,2 g; 2 mmol) and 60 ml of anhydrous tetrahydrofuran (THF) (Aldrich), the reaction mixture was placed at −78° C. for about 10 minutes. Subsequently, 4.4 ml of a lithium di-isopropylamine (LDA) solution (Aldrich) were added dropwise into a tetrahydrofuran (THF) (Aldrich)/hexane (Aldrich) (1:1, v/v) 1.0 M (0.471 g; 4.4 mmol) mixture and the reaction mixture was maintained at −78° C. for 3 hours. 0.678 ml of tributyltin chloride (Aldrich) (1.627 g; 5 mmol) was then added dropwise: the resulting reaction mixture was maintained at −78° C. for 30 minutes and at ambient temperature for 16 hours. The reaction mixture was then placed in a 500 ml separating funnel: said reaction mixture was diluted with a 0.1 M solution of sodium bicarbonate (Aldrich) (200 ml) and extracted with diethyl ether (Aldrich) (3×100 ml), yielding an acidic aqueous phase and an organic phase. The entire organic phase (obtained by combining the organic phases resulting from the three extractions) was washed at neutral with water (3×50 ml) and then dried on sodium sulfate (Aldrich) and evaporated. The residue obtained was purified by elution on a chromatographic column of basic alumina (Aldrich) [(eluent: n-heptane/ethyl acetate 99/1 v/v) (Carlo Erba)], obtaining 5.595 g of 4,7-bis[5-(tributylstannyl)thiophene-2-yl]-5,6-difluoro-2-(2-octyldodecyl)-2H-benzotriazole having formula (IIIa) as straw yellow oil (yield 95%).

Example 2

Preparation of the Conjugated Polymer Having Formula (Ia)

(Ia)

To a 250 ml flask, equipped with magnetic stirring, thermometer and refrigerant, in an inert atmosphere the following were added in the following order: 2,7-dibromo-5,5-bis(3,7-dimethyloctyl)-5H-1,8-dithia-as-indacen-4-one having formula (XIIb) obtained as described in Example 13 of the international patent application WO 2016/180988 above reported (1.483 g; 2.3 mmol), 60 ml of toluene (Aldrich), 4,7-bis[5-(tributylstannyl)thiophene-2-yl]-5,6-difluoro-2-(2-octyldodecyl)-2H-benzotriazole having formula (IIIa) obtained as described in Example 1 (2.709 g; 2.3 mmol), tris(dibenzylidene-acetone)dipalladium(0) [Pd$_2$(dba)$_3$] (Aldrich) (0.042 g; 0.046 mmol) and tris(ortho-tolyl)phosphine [P(o-tol)$_3$] (Aldrich) (0.140 g; 0.46 mmol). Subsequently, the reaction mixture obtained was heated up under reflux and maintained, with stirring, for 48 hours: the colour of the reaction mixture became purple after 3 hours and became dark purple at the end of the reaction (i.e. after 24 hours). After cooling to room temperature (25° C.), the resulting reaction mixture was then placed in methanol (Aldrich) (300 ml) and the precipitate obtained was sequentially extracted in a Soxhlet apparatus with methanol (Aldrich), acetone (Aldrich), n-heptane (Aldrich), and finally chloroform (Aldrich). The residue left inside the extractor was dissolved in chlorobenzene (50 ml) (Aldrich) at 80'C. The hot solution was precipitated in methanol (300 ml) (Aldrich). The precipitate obtained was collected and dried under vacuum at 50'C for 16 hours, yielding 2.167 g of a dark purple solid product (yield 80%), corresponding to the conjugated polymer having formula (Ia).

Said solid product was subjected to molecular weight determination by Gel Permeation Chromatography (GPC) as described above, obtaining the following data:

($M_w$)=65424 Dalton;
(PDI)=2.0128.

In addition, the optical band-gap values, both in solution ($E_g^{opt}{}_{solution}$) and on thin film ($E_g^{opt}{}_{film}$), and the value of HOMO were determined, working as described above:

($\lambda_{EDGE}$ sol)=636 nm;
($\lambda_{EDGE}$ film)=644 nm;
$E_{g.opt.sol}$=1.95 eV;
$E_{g.opt.film}$=1.93 eV;
(HOMO)=−5.39 eV.

Example 3

Preparation of 4,5-dodecyl-4,5-dihydro-1,8-dithia-as-indacene-4,5-diol Having Formula (IIa)

(IIa)

To a 250 ml two-neck Pyrex glass flask equipped with magnetic stirring, thermometer and refrigerant, in an inert atmosphere the following were added in the following order: 100 ml of anhydrous tetrahydrofuran (THF) (Aldrich), n-dodecyl-magnesium bromide (Aldrich) (19.656 g; 72.0 mmol), benzo[1,2-b:6,5-b']dithiophene-4,5-dione having formula (VIa) obtained as described in Example 3 of international patent application WO 2016/180988 above reported (2.643 g; 12.0 mmol): the reaction mixture was cooled to 0° C. and maintained, while stirring, at this temperature, for 1 hour. Subsequently, the reaction mixture was heated to ambient temperature (25'C), and maintained at this temperature, while stirring, for 3 hours. The reaction mixture was then placed in a 500 ml separating funnel, diluted with a saturated aqueous solution of ammonium chloride (Aldrich) (50 ml), concentrated, diluted again with a saturated aqueous solution of ammonium chloride (Aldrich) (100 ml) and extracted with ethyl acetate (Aldrich) (3×100 ml), yielding an acidic aqueous phase and an organic phase. The entire organic phase (obtained by combining the organic phases resulting from the three extractions) was washed at neutral with water (3×50 ml) and then dried on sodium sulfate (Aldrich) and evaporated. The residue obtained was purified by eluting on a chromatographic column of silica gel [(eluent: n-heptane/ethyl acetate 9/1) (Carlo Erba)], obtaining 3.029 g of 4,5-didodecyl-4,5-dihydro-1,8-di-dithia-as-indacene-4,5-diol having formula (IIa) as pale yellow oil (yield 45%).

Example 4

Preparation of 5,5-didodecyl-5H-1,8-dithia-as-indacen-4-one Having Formula (IIb)

(IIb)

To a 100 ml flask, equipped with magnetic stirring, thermometer and refrigerant, in an inert atmosphere the following were added in the following order: 4,5-didodecyl-4,5-dihydro-1,8-dithia-as-indacene-4,5-diol having formula (IIa) obtained as described in Example 3 (2.715 g; 5.00 mmol), 50 ml of toluene (Aldrich), para-toluenesulfonic acid (Aldrich) (0.162 g; 0.85 mmol): the reaction mixture was heated under reflux and maintained under reflux, while stirring, for 1.5 hours. Subsequently, after cooling to room temperature (25'C), the reaction mixture was placed in a 500 ml separating funnel, diluted with a saturated aqueous solution of sodium chloride (Aldrich) (100 ml) and extracted with ethyl acetate (Aldrich) (3×50 ml), yielding an acidic aqueous phase and an organic phase. The entire organic phase (obtained by combining the organic phases resulting from the three extractions) was washed at neutral with water (3×50 ml), then dried on sodium sulfate (Aldrich) and evaporated. The residue obtained was purified by eluting on a chromatographic column of silica gel [(eluent: n-heptane/ethyl acetate 99/1) (Carlo Erba)], obtaining 2.660 g of 5,5-didodecyl-5H-1,8-dia-as-indacen-4-one having formula (IIb) as pale yellow oil (yield 98%).

Example 5

Preparation of 2,7-dibromo-5,5-didodecyl-5H-1,8-dithia-as-indacen-4-one Having Formula IIc (IIc)

To a 100 ml flask, equipped with magnetic stirring, thermometer and refrigerant, in an inert atmosphere the following were added in the following order: 5,5-didodecyl-5H-1,8-dithia-as-indacen-4-one having formula (IIb) obtained as described in Example 4 (2.714 g; 5.00 mmol), 40 ml of N,N-dimethylformamide (Aldrich), N-bromosuccinimide (Aldrich) (1.781 g; 10.01 mmol): the reaction mixture was protected from light and maintained at ambient temperature (25° C.), while stirring, for 16 hours. Subsequently, the reaction mixture was placed in a 500 ml separating funnel: said reaction mixture was diluted with a 0.1 M solution of sodium thiosulphate (Aldrich) (100 ml) and extracted with diethyl ether (Aldrich) (3×50 ml), yielding an acidic aqueous phase and an organic phase. The entire organic phase (obtained by combining the organic phases resulting from the three extractions) was washed at neutral with water (3×50 ml) and then dried on sodium sulfate (Aldrich) and evaporated. The residue obtained was purified by eluting on a chromatographic column of silica gel [(eluent: n-heptane/ethyl acetate 99/1) (Carlo Erba)], obtaining 3.328 g of 2,7-dibromo-5,5-didodecyl-5H-1,8-dithia-as-indacen-4-one having formula (IIc) as yellow-green solid (yield 95%).

Example 6

Preparation of the Conjugated Polymer Having Formula (Ib)

(Ib)

To a 500-ml flask equipped with magnetic stirring, thermometer and refrigerant, in an inert atmosphere the following were added in the following order: 2,7-dibromo-5,5-didodecyl-5H-1,8-dithia-as-indacen-4-one having formula (IIc) obtained as described in Example 5 (6.152 g; 8.78 mmol), 230 ml of toluene (Aldrich), 4,7-bis[5-(tributylstannyl)thiophene-2-yl]-5,6-difluoro-2-(2-octyldodecyl)-2H-benzotriazole having formula (IIIa) obtained as described in Example 1 (10.343 g; 8.78 mmol), tris(dibenzylideneacetone)dipalladium(0) [$Pd_2(dba)_3$] (Aldrich) (0.161 g; 0.175 mmol) and tris(ortho-tolyl)phosphine [$P(o\text{-}tol)_3$] (Aldrich) (0.053 g; 0.175 mmol). Subsequently, the reaction mixture obtained was heated under reflux and maintained, while stirring, for 24 hours: the colour of the reaction mixture became purple after 3 hours and became dark purple at the end of the reaction (i.e. after 24 hours). Then, after cooling to ambient temperature (25° C.), the resulting reaction mixture was placed in methanol (Aldrich) (300 ml) and the precipitate obtained was sequentially extracted in a Soxhlet apparatus with methanol (Aldrich), acetone (Aldrich), n-heptane (Aldrich), and finally chloroform (Aldrich). The residue remaining in the extractor was dissolved in chlorobenzene (50 ml) (Aldrich) at 80° C. The hot solution was precipitated in methanol (300 ml) (Aldrich). The precipitate obtained was collected and dried under vacuum at 50° C., for 16 hours, yielding 7.5 g of a dark purple solid product (75% yield), corresponding to the conjugated polymer having formula (Ib).

Said solid product was subjected to molecular weight determination by Gel Permeation Chromatography (GPC), working as described above, obtaining the following data:

$(M_w)$=41941 Dalton;

(PDI)=1.7558.

In addition, the optical band-gap values, both in solution ($E_g^{opt}{}_{solution}$) and on thin film ($E_g^{opt}{}_{film}$) and the value of HOMO were determined, working as described above:

($\lambda_{EDGE}$ sol)=636 nm;
($\lambda_{EDGE}$ film)=656 nm;
$E_{g.opt.sol}$=1.95 eV;
$E_{g.opt.film}$=1.89 eV;
(HOMO)=−5.41 eV.

Example 7 (Comparative)

Solar Cell Comprising regioregular poly(3)-hexylthiophene-(P3HT)

For this purpose, an inverted polymer solar cell, shown schematically in FIG. 5, was used.

To this end, a polymer-based device was prepared on a glass substrate coated with ITO (indium tin oxide) (Kintec Company-Hong Kong), previously subjected to a cleaning procedure consisting of manual cleaning, rubbing with a lint-free cloth soaked in a detergent diluted with mains water. The substrate was then rinsed with mains water. Subsequently, the substrate was thoroughly cleaned using the following methods in sequence: ultrasonic baths in (i) distilled water plus detergent (followed by manual drying with a lint-free cloth); (ii) distilled water [followed by manual drying with a lint-free cloth]; (iii) acetone (Aldrich) and (iv) iso-propanol (Aldrich) in sequence. In particular, the substrate was put in a beaker containing the solvent, placed in an ultrasonic bath, maintained at 40° C., for a treatment of 10 minutes. After treatments (iii) and (iv), the substrate was dried with a flow of compressed nitrogen.

Subsequently, the glass/ITO was further cleaned in an air plasma device (Tucano type-Gambetti), immediately before proceeding to the next step.

The substrate thus treated was ready for deposition of the cathodic buffer layer. To this end, the zinc oxide (ZnO) buffer layer was obtained from a 0.162 M solution of the [$Zn^{2+}$]-ethanolamine (Aldrich) complex in butanol (Aldrich). The solution was deposited by rotation on the substrate by working at a rotation speed of 600 rpm (acceleration of 300 rpm/s), for 2 minutes and 30 seconds, and then at a rotation speed of 1500 rpm, for 5 seconds. Immediately after deposition of the cathodic buffer layer, zinc oxide formation was achieved by thermally treating the device at 140° C., for 5 minutes, on a hot plate in ambient air. The resulting cathodic buffer layer had a thickness of 30 nm and was partially removed from the surface with acetic acid 0.1 M (Aldrich), leaving the layer only on the desired surface.

The active layer, comprising regioregular poly(3)hexylthiophene (P3HT) (Plexcore OS) and [6,6]-phenyl-$C_{61}$-butyric acid methyl ester (PCBM) (Aldrich), was deposited on top of the cathodic buffer layer by spin-coating of a solution 1:0.8 (v:v) in o-dichlorobenzene (Aldrich) with a concentration of P3HT of 10 mg/ml, which was maintained while stirring throughout the night, operating at a rotation speed of 300 rpm (acceleration of 255 rpm/s), for 90 seconds. The thickness of the active layer was found to be 250 nm.

On top of the active layer thus obtained, the anodic buffer layer was deposited, having been obtained by deposition of molybdenum oxide ($MoO_3$) (Aldrich) by a thermal process: the thickness of the anodic buffer layer was equal to 10 nm. On top of the anodic buffer layer the silver anode (Ag) was deposited with a thickness of 100 nm, by evaporation under vacuum, appropriately masking the area of the device in order to obtain an active area of 25 $mm^2$.

The depositions of the anodic buffer layer and of the anode were carried out in a standard vacuum evaporation chamber containing the substrate and two evaporation vessels equipped with a heating element containing 10 mg of molybdenum oxide ($MoO_3$) powder and 10 shots of silver (Ag) (diameter 1 mm-3 mm) (Aldrich), respectively. The evaporation process was conducted under vacuum, at a pressure of about $1\times10^{-6}$ bar. Following evaporation, the molybdenum oxide ($MoO_3$) and silver (Ag) are condensed in the non-masked parts of the device.

The thicknesses were measured with a Dektak 150 profile meter (Veeco Instruments Inc.).

The electrical characterization of the device obtained was carried out in a controlled atmosphere (nitrogen) in a glove box, at ambient temperature (25° C.). The current-voltage (I-V) curves were acquired with a Keithley® 2600A multimeter connected to a personal computer for data collection. The photocurrent was measured by exposing the device to the light of an ABET SUN® 2000-4 solar simulator, capable of providing irradiation of 1.5G AM with an intensity of 100 $mW/cm^2$ (1 sun), measured with an Ophir Nova® II powermeter connected to a 3A-P thermal sensor. In particular, the device is masked before said electrical characterization, so as to obtain an effective active area equal to 16 $mm^2$: Table 1 shows the four characteristic parameters as average values.

Example 8 (Disclosure)

Solar Cell Comprising Conjugated Polymer Having Formula (Ia)

A polymer-based device was prepared on a glass substrate coated with ITO (indium-tin oxide) (Kintec Company-Hong Kong), which had previously undergone a cleaning procedure working as described in Example 7.

The deposition of the cathodic buffer layer and the deposition of the anodic buffer layer were carried out as described in Example 7; the composition of said cathodic buffer layer and the composition of said anodic buffer layer are the same as those reported in Example 7; the thickness of said cathodic buffer layer and the thickness of said anodic buffer layer are the same as those reported in Example 7.

On top of the cathodic buffer layer thus obtained, the active layer, comprising the conjugated polymer having formula (Ia) obtained as described in Example 2 and [6,6]-phenyl-$C_{61}$-butyric acid methyl ester (PCBM) (Aldrich), was deposited by spin-coating of a 1:2 (v:v) solution in o-dichlorobenzene (Aldrich) with a concentration of conjugated polymer having formula (Ia) of 18 mg/ml that had been maintained while stirring overnight, operating at a rotation speed of 5000 rpm (acceleration of 2500 rpm/s), for 30 seconds. The thickness of the active layer was found to be 60 nm.

The deposition of the silver anode (Ag) was carried out as described in Example 7: the thickness of said silver anode (Ag) is the same as reported in Example 7.

The thicknesses were measured with a Dektak 150 profile meter (Veeco Instruments Inc.).

The electrical characterization of the device obtained was carried out as described in Example 7: in Table 1, the four characteristic parameters are given as average values.

Figure 1:
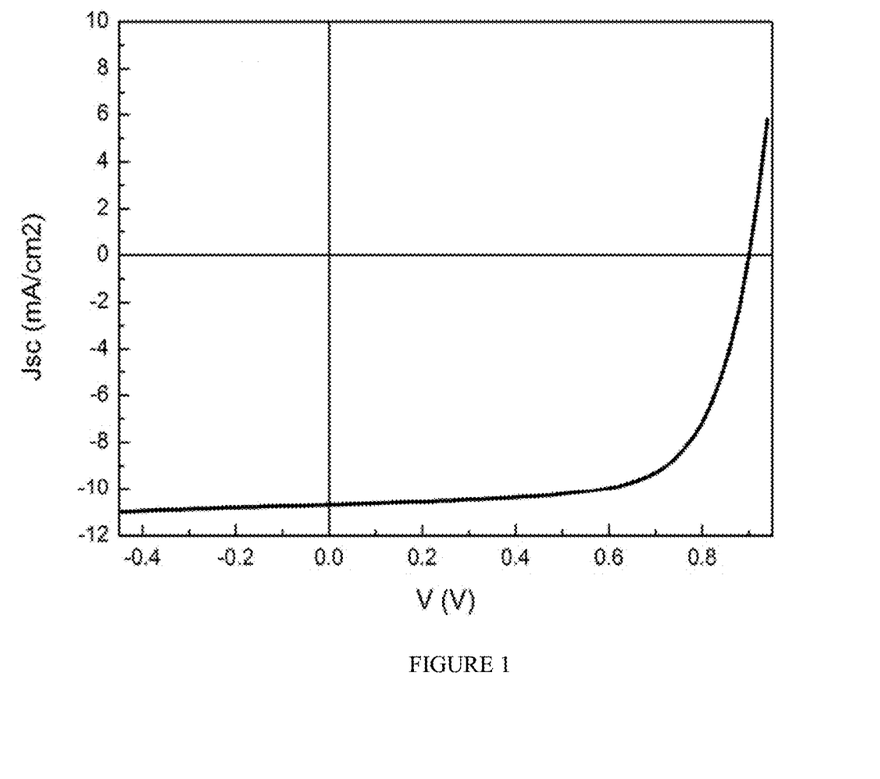
FIG. 1 depicts a plot of a current-voltage (I-V) curve versus short-circuit current density ($J_{sc}$).

FIG. 1 shows the current-voltage (I-V) curve obtained [the X axis gives the voltage in volts (V); the Y axis gives the short-circuit current density ($J_{sc}$) in milliampere/$cm^2$ (mA/$cm^2$)].

Figure 3:
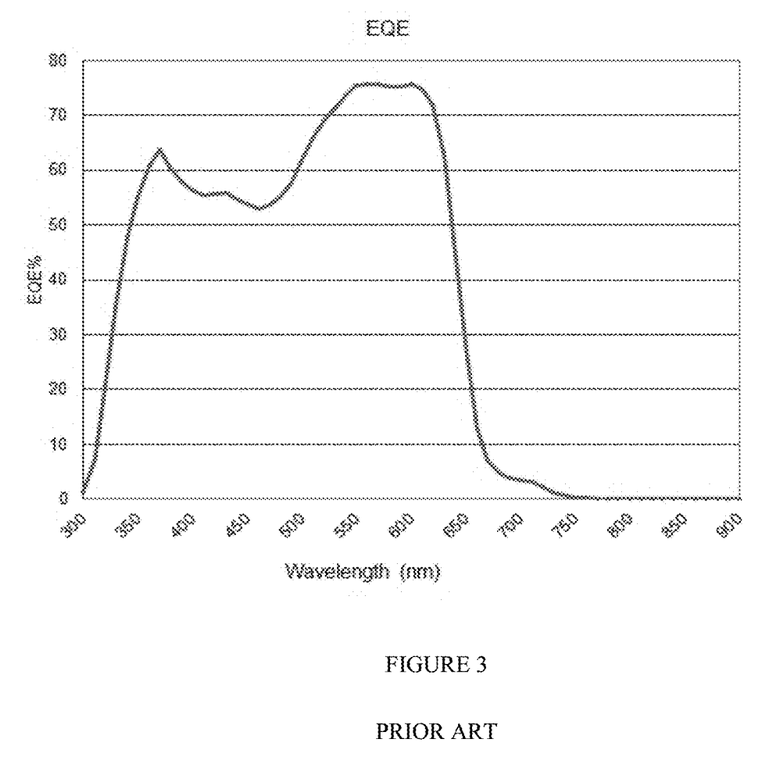
FIG. 3 depicts a plot of an External Quantum Efficiency (EQE) curve recorded under a monochromatic light versus External Quantitative Efficiency (EQE).

FIG. 3 shows the External Quantum Efficiency (EQE) curve that was recorded under a monochromatic light (obtained with a TMc300F-U (I/C) monochromator-triple grating monochromator—and a double source with a Xenon lamp and a quartz halogen lamp) in an instrument from Bentham Instruments Ltd [the X axis gives the wavelength in nanometres (nm); the Y axis gives the External Quantitative Efficiency (EQE) in percent (%)].

Example 9 (Disclosure)

Solar Cell Comprising Conjugated Polymer Having Formula (Ib)

A polymer-based device was prepared on a glass substrate coated with ITO (indium-tin oxide) (Kintec Company-Hong Kong), which had previously undergone a cleaning procedure working as described in Example 7.

The deposition of the cathodic buffer layer and the deposition of the anodic buffer layer were carried out as described in Example 7; the composition of said cathodic buffer layer and the composition of said anodic buffer layer are the same as those reported in Example 7; the thickness of said cathodic buffer layer and the thickness of said anodic buffer layer are the same as those reported in Example 7.

On top of the thus-obtained cathodic buffer layer the active layer, comprising the conjugated polymer having formula (Ib) obtained as described in Example 6 and [6,6]-phenyl-$C_{61}$-butyric acid methyl ester (PCBM) (Aldrich), was deposited by spin-coating of a 1:2 (v:v) solution in o-dichlorobenzene (Aldrich) with a concentration of conjugated polymer having a formula (Ib) of 18 mg/ml that was maintained while stirring overnight, operating at a rotation speed of 5000 rpm (acceleration of 2500 rpm/s), for 30 seconds. The thickness of the active layer was found to be 60 nm.

The deposition of the silver anode (Ag) was carried out as described in Example 7: the thickness of said silver anode (Ag) is the same as reported in Example 7.

The thicknesses were measured with a Dektak 150 profile meter (Veeco Instruments Inc.).

The electrical characterization of the device obtained was carried out as described in Example 7: in Table 1, the four characteristic parameters are given as average values.

Figure 2:
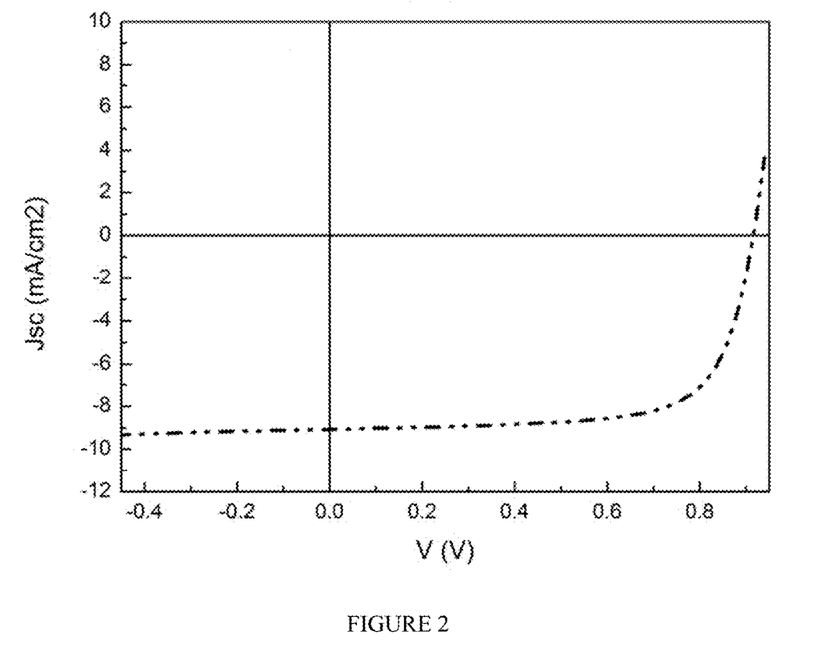
FIG. 2 depicts a plot of an (I-V) curve versus $J_{sc}$.

FIG. 2 shows the obtained current-voltage (I-V) curve [the X axis gives the voltage in volts (V); the Y axis gives the short-circuit current density ($J_{sc}$) in milliampere/$cm^2$ (mA/$cm^2$)].

Figure 4:
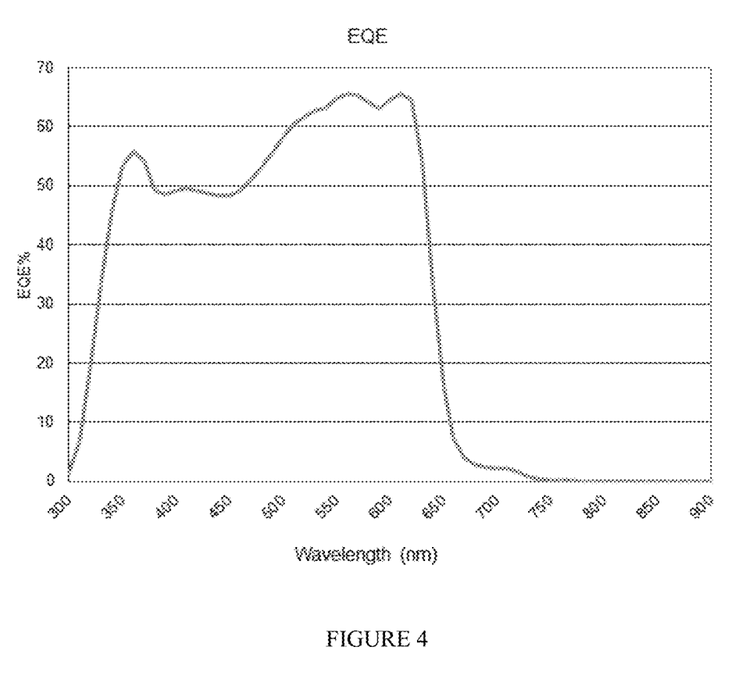
FIG. 4 depicts another plot of an External Quantum Efficiency (EQE) curve recorded under a monochromatic light versus External Quantitative Efficiency (EQE).

FIG. 4 shows the External Quantum Efficiency (EQE) curve that was recorded under a monochromatic light (obtained with a TMc300E-U (I/C) monochromator-triple grating monochromator—and a double source with a Xenon lamp and a quartz halogen lamp) in an instrument from Bentham Instruments Ltd [the X axis gives the wavelength in nanometres (nm); the Y axis gives the External Quantitative Efficiency (EQE) in percent (%)].

TABLE 1

| EXAMPLE | FF[1] | $V_{OC}$[2] (V) | $J_{SC}$[3] (mA/$cm^2$) | $PCE_{av}$[4] (%) |
|---|---|---|---|---|
| 7 (comparative) | 0.57 | 0.56 | 10.10 | 3.30 |
| 8 (disclosure) | 0.68 | 0.90 | 10.69 | 6.54 |
| 9 (disclosure) | 0.71 | 0.92 | 9.08 | 5.93 |

(1): FF (Fill Factor) is calculated according to the following equation:

$$\frac{V_{MPP} \cdot J_{MPP}}{V_{OC} \cdot J_{SC}}$$

wherein $V_{MPP}$ and $J_{MPP}$ are, respectively, voltage and current density corresponding to the point of maximum power, $V_{OC}$ is the open-circuit voltage and $J_{sc}$ is the short-circuit current density;
(2): $V_{OC}$ is the open-circuit voltage;
(3): $J_{SC}$ is the short-circuit current density;
(4): $PCE_{av}$ is the efficiency of the device, calculated according to the following equation:

$$\frac{V_{OC} \cdot J_{SC} \cdot FF}{P_{in}}$$

wherein $V_{OC}$, $J_{SC}$ and FF have the same meanings above reported and $P_{in}$ is the intensity of incident light on the device.

The invention claimed is:
1. Conjugated polymer comprising a derivative of indacen-4-one having general formula (I):

wherein:
$R_1$ and $R_2$, the same as or different from each other, are selected from $C_1$-$C_{30}$ alkyl groups, linear or branched; optionally substituted cycloalkyl groups; optionally substituted aryl groups; optionally substituted heteroaryl groups; $C_1$-$C_{30}$ alkoxyl groups, linear or branched; $R_4$—O—[$CH_2$—$CH_2$—O]$_n$- polyoxyethylene groups, wherein $R_4$ is selected from $C_1$-$C_{30}$ alkyl groups, linear or branched, and n is an integer ranging from 1 to 4; —$R_5$—$OR_6$ groups, wherein $R_5$ is selected from $C_1$-$C_{30}$ alkylene groups, linear or branched, and $R_6$ represents a hydrogen atom or is selected from $C_1$-$C_{30}$ alkyl groups, linear or branched, or is selected from $R_4$—[—$OCH_2$—$CH_2$-]$_p$-polyoxyethylene groups, wherein $R_4$ has the same meanings as reported above and p is an integer ranging from 1 to 4; —$COR_7$ groups, wherein $R_7$ is selected from $C_1$-$C_{30}$ alkyl groups, linear or branched; —$COOR_8$ groups, wherein $R_8$ is selected from $C_1$-$C_{30}$ alkyl groups, linear or branched; or they represent a —CHO group, or a cyano (—CN) group;
$R_3$ is selected from $C_1$-$C_{30}$ alkyl groups, linear or branched; optionally substituted cycloalkyl groups; optionally substituted aryl groups; and $C_1$-$C_{30}$ alkoxyl groups, linear or branched;
n is an integer ranging from 10 to 500.

2. Conjugated polymer comprising a derivative of indacen-4-one having general formula (I) according to claim 1, wherein in said general formula (I):

$R_1$ and $R_2$, the same as each other, are selected from $C_1$-$C_{30}$ alkyl groups, -linear or branched;

$R_3$ is selected from $C_1$-$C_{30}$ alkyl groups, linear or branched;

n is an integer ranging from 20 to 300.

3. Photovoltaic device either on a rigid support, or on a flexible support, comprising at least one conjugated polymer comprising a derivative of indacen-4-one having general formula (I) according to claim 1.

4. Conjugated polymer according to claim 1, wherein $R_1$ and $R_2$ are selected from $C_2$-$C_{20}$ alkyl groups; optionally substituted cycloalkyl groups; optionally substituted aryl groups; optionally substituted heteroaryl groups; $C_2$-$C_{20}$ alkoxyl groups, linear or branched; and $R_4$—O—[$CH_2$—$CH_2$—O]$_n$— polyoxyethylene groups.

5. Conjugated polymer according to claim 1, wherein $R_3$ is selected from $C_2$-$C_{20}$ alkyl groups; optionally substituted cycloalkyl groups; optionally substituted aryl groups; and $C_2$-$C_{20}$, alkoxyl groups.

6. Conjugated polymer according to claim 5, wherein $R_3$ is 2-octyldodecyl group.

7. Conjugated polymer according to claim 1, wherein $R_4$ is selected from $C_2$-$C_{20}$ alkyl groups.

8. Conjugated polymer according to claim 1, wherein $R_5$ is selected from $C_2$-$C_{20}$ alkylene groups.

9. Conjugated polymer according to claim 1, wherein $R_6$ represents a hydrogen atom or is selected from $C_2$-$C_{20}$ alkyl groups.

10. Conjugated polymer according to claim 1, wherein $R_7$ is selected from $C_2$-$C_{20}$ alkyl groups.

11. Conjugated polymer according to claim 1, wherein $R_8$ is selected from $C_2$-$C_{20}$, alkyl groups, linear or branched; or they represent a —CHO group, or a cyano (—CN) group.

* * * * *